US010199406B2

(12) United States Patent
Huang et al.

(10) Patent No.: US 10,199,406 B2
(45) Date of Patent: Feb. 5, 2019

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); SHANGHAI JIAO TONG UNIVERSITY, Shanghai (CN)

(72) Inventors: Wei Huang, Beijing (CN); Jiaqing Zhao, Beijing (CN); Linrun Feng, Beijing (CN); Wei Tang, Beijing (CN); Xiaojun Guo, Beijing (CN)

(73) Assignees: BOE TECHNOLOGY GROUP CO., LTD., Beijing (CN); SHANGHAI JIAO TONG UNIVERSITY, Shanghai (CN)

( * ) Notice: Subject to any disclaimer, the term of this patent is extended or adjusted under 35 U.S.C. 154(b) by 0 days.

(21) Appl. No.: 15/175,700

(22) Filed: Jun. 7, 2016

(65) Prior Publication Data
US 2017/0025449 A1 Jan. 26, 2017

(30) Foreign Application Priority Data
Jul. 22, 2015 (CN) .......................... 2015 1 0435044

(51) Int. Cl.
*H01L 27/12* (2006.01)
*H01L 29/49* (2006.01)
*H01L 29/66* (2006.01)

(52) U.S. Cl.
CPC ........ *H01L 27/1292* (2013.01); *H01L 27/127* (2013.01); *H01L 29/4908* (2013.01); *H01L 29/66765* (2013.01); *H01L 29/66969* (2013.01)

(58) Field of Classification Search
None
See application file for complete search history.

(56) References Cited

U.S. PATENT DOCUMENTS 6,518,168 B1    2/2003  Clem et al.
2005/0059193 A1*  3/2005  Yoneya ............. H01L 21/32051
                                                         438/151
(Continued)

FOREIGN PATENT DOCUMENTS

CN   1595614 A     3/2005
CN   101926016 A  12/2010

OTHER PUBLICATIONS

The First Chinese Office Action dated Aug. 3, 2017; Appln. 201510435044.1.
(Continued)

*Primary Examiner* — Cory W Eskridge
(74) *Attorney, Agent, or Firm* — Ladas & Parry LLP

(57) ABSTRACT

An array substrate and a manufacturing method thereof, a display panel and a display device are provided. The array substrate manufacturing method comprises: forming a source electrode and a drain electrode on a gate insulating layer; forming photoresist above the gate insulating layer and the source electrode and the drain electrode; etching the photoresist to form an opening region so as to expose the gate insulating layer between the source electrode and the drain electrode, and a part of the source electrode and a part of the drain electrode; and forming an active layer in the opening region, the active layer covering the exposed gate insulating layer, the part of the source electrode and the part of the drain electrode.

12 Claims, 2 Drawing Sheets

(56) References Cited

U.S. PATENT DOCUMENTS

2009/0224664 A1* 9/2009 Yoshida .............. H01L 27/3246
 313/504
2010/0314614 A1* 12/2010 Bale ................... H01L 27/3274
 257/40
2011/0104877 A1* 5/2011 Kunze ................... C09D 11/52
 438/478

OTHER PUBLICATIONS

The Second Chinese Office Action dated Oct. 20, 2017; Appln. 201510435044.1.
The Third Chinese Office Acton dated Jan. 31, 2018; Appln. No. 201510435044.1.

* cited by examiner

ARRAY SUBSTRATE AND MANUFACTURING METHOD THEREOF, DISPLAY PANEL AND DISPLAY DEVICE

TECHNICAL FIELD

Embodiments of the present disclosure relate to an array substrate and a manufacturing method thereof, a display panel and a display device.

BACKGROUND

At present, in a process for manufacturing a thin film transistor, an active layer is formed in such a manner: firstly, forming a semiconductor layer, and then, etching the semiconductor layer, so as to reserve the semiconductor layer in a channel region as the active layer.

Thus, the reserved semiconductor layer (i.e., the active layer) can be damaged by a process for etching the semiconductor layer, and even if an etch stop layer is formed on the semiconductor layer and damage brought to the reserved semiconductor layer by etching cannot be completely avoided.

SUMMARY

Embodiments of the present disclosure relate to an array substrate and a manufacturing method thereof, a display panel and a display device, which can avoid damage to the active layer in a process for forming a thin film transistor.

In one aspect, an embodiment of the present disclosure provides an array substrate manufacturing method, comprising: forming a source electrode and a drain electrode on a gate insulating layer; forming photoresist above the gate insulating layer and the source electrode and the drain electrode; etching the photoresist to form an opening region so as to expose the gate insulating layer between the source electrode and the drain electrode, and a part of the source electrode and a part of the drain electrode; and forming an active layer in the opening region, the active layer covering the exposed gate insulating layer, the part of the source electrode and the part of the drain electrode.

In another aspect, an embodiment of the present disclosure provides an array substrate, comprising: a gate insulating layer; a source electrode and a drain electrode, arranged on the gate insulating layer; an active layer, formed on the gate insulating layer on which the source electrode and the drain electrode are formed and covering a part of the source electrode, a part of the drain electrode and the gate insulating layer between the source electrode and the drain electrode.

In still another aspect, an embodiment of the present disclosure provides a display panel, comprising the array substrate as mentioned above.

In still another aspect, an embodiment of the present disclosure provides display device, comprising the display panel as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The specific details described as follows help to fully understand the present disclosure. However, the present disclosure could be implemented by other methods different from the embodiments described as follows, so the embodiments disclosed as follows are not intended to limit the protection scope of the present disclosure.

Figure 1:
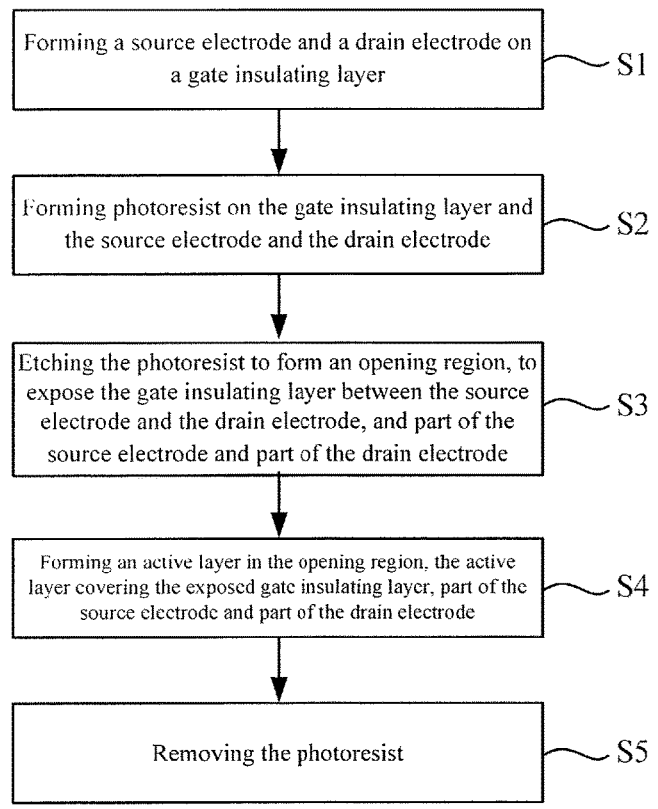
FIG. 1 shows a schematic flow diagram of an array substrate manufacturing method according to an embodiment of the present disclosure.
Figure 2:
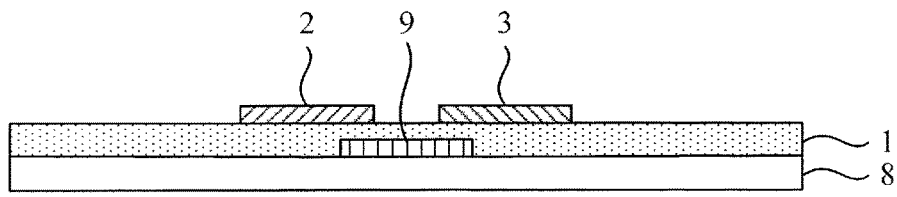
FIGS. 2-6 show sectional views of an array substrate obtained by steps of an array substrate manufacturing method according to an embodiment of the present disclosure.
Figure 3:
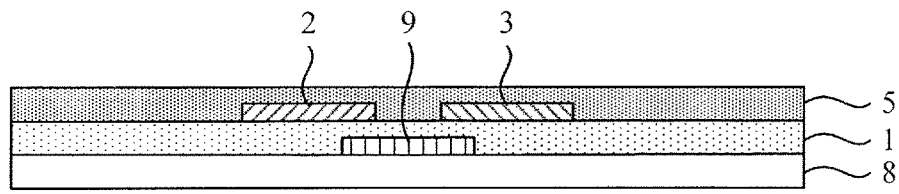
Figure 4:
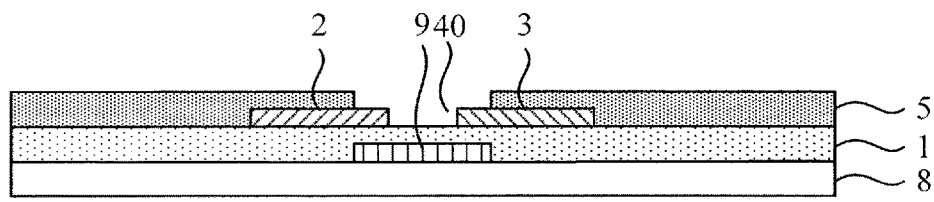
Figure 5:
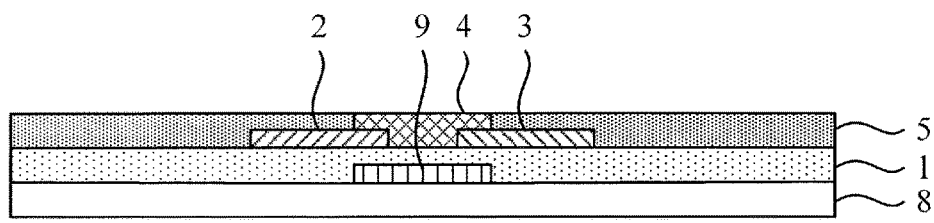

As shown in FIG. 1, an array substrate manufacturing method according to an embodiment of the present disclosure, comprises:

S1: forming a source electrode 2 and a drain electrode 3 on a gate insulating layer 1, as shown in FIG. 2, wherein before the forming the source electrode 2 and the drain electrode 3, the array substrate manufacturing method according to an embodiment of the present disclosure, further comprises: forming a gate electrode on a substrate 8, and forming the gate insulating layer 1 on the gate electrode 9 and the substrate 8;

S2: forming a photoresist 5 above the gate insulating layer 1 and the source electrode 2 and the drain electrode 3, as shown in FIG. 3;

S3: etching the photoresist 5 to form an opening region 40, so as to expose the gate insulating layer 1 between the source electrode 2 and the drain electrode 3, and a part of the source electrode 2 and a part of the drain electrode 3, as shown in FIG. 4;

S4: forming an active layer 4 in the opening region, wherein the active layer 4 covers the exposed gate insulating layer 1, the part of the source electrode 2 and the part of the drain electrode 3, as shown in FIG. 5.

The opening region is formed by the photoresist 5, thus a region in which the active layer 4 is formed may be defined, and then, the active layer 4 may be directly formed in the opening region; with respect to a process of firstly forming a semiconductor layer, and then etching the semiconductor layer to form the active layer, it is not necessary to etch a semiconductor material for forming the active layer, thereby avoiding damage to the active layer 4 and guaranteeing the good contact between the active layer 4 and the source and drain electrodes 2 and 3, so that the source electrode 2 and the drain electrode 3 can be conducted very well when turned on, and the good performance of a thin film transistor is ensured.

Moreover, as the active layer 4 is formed on the source electrode 2 and the drain electrode 3, even if treatment needs to be performed on the active layer 4 by a following process, only an upper surface of the active layer 4 can be influenced, a side of the active layer 4 in contact with the source electrode 2 and the drain electrode 3 is not influenced, which still can guarantee that the active layer 4 is in good contact with the source electrode 2 and the drain electrode 3.

Exemplarily, the forming the active layer 4 in the opening region includes: filling the semiconductor material in the opening region so as to form the active layer, for example, applying the semiconductor material in the opening region so as to form the active layer 4.

Exemplarily, a difference between a surface energy of the photoresist 5 and a surface energy of the gate insulating layer 1 is greater than a preset value.

By selecting the specific photoresist 5 and/or a material of the gate insulating layer 1, the difference between the surface energy (i.e., surface tension) of the photoresist 5 and the surface energy of the gate insulating layer 1 may be relatively greater, for example, a the difference is up to 0.01 N/m, wherein the surface energy of the photoresist 5 is higher, and the surface energy of the gate insulating layer 1 is lower, while wettability of a semiconductor material solution with respect to a material with the lower surface energy is higher, and wettability of the semiconductor material solution with respect to a material with the higher surface energy is lower, and therefore when applied to the opening region, the semiconductor material solution is not easy to attach to the photoresist 5, but easy to attach to the gate insulating layer 1, so that the active layer 4 formed by the semiconductor material solution is defined in the opening region better.

Exemplarily, the forming the active layer 4 in the opening region includes:

Applying the semiconductor material solution to the opening region by a solution processing method of ink-jet printing, silk-screen printing, blade coating or spin coating and the like so as to form the active layer 4, wherein the thickness of the formed active layer 4 may be accurately controlled conveniently.

Exemplarily, a length-width ratio of the opening region is 10:1 to 50:1. The formed active layer 4 with the corresponding length-width ratio in the opening region with the length-width ratio of 10:1 to 50:1 may be well conducted under drive of the gate electrode 9, and then, the source electrode 2 and the drain electrode 3 are conducted.

Exemplarily, the semiconductor material solution is applied to the opening region by the solution processing method of ink-jet printing so as to form the active layer 4, and a width of the opening region is 5 μm to 50 μm. The semiconductor material solution may be applied into a narrower opening region by the ink-jet printing method, so that the width of the opening region may be set to be smaller to decrease a region occupied by the thin film transistor and increase an aperture ratio.

Exemplarily, the semiconductor material solution is applied to the opening region by the solution processing method of silk-screen printing, blade coating or spin coating and the like so as to form the active layer, and the width of the opening region is 30 μm to 100 μm. As larger coating area is needed by silk-screen printing, blade coating or spin coating, the opening region needs to be set to be wider.

Exemplarily, after applying the semiconductor material solution to the opening region by the solution processing method of blade coating and/or spin coating so as to form the active layer 4, the array substrate manufacturing method according to an embodiment of the present disclosure further includes:

Removing the semiconductor material outside the opening region.

The active layer 4 may be directly formed in the opening region by the method of ink-jet printing and silk-screen printing, while a semiconductor layer is formed in the opening region and above the photoresist by the method of blade coating and spin coating, so that the semiconductor material outside the opening region needs to be removed, for example, the semiconductor material outside the opening region is removed by dry etching, wet etching or laser.

For the active layer 4 formed by any above-mentioned method, as the semiconductor material applied in the opening region covers the source electrode 2 and the drain electrode 3, even if the semiconductor material is removed subsequently, only the upper surface of the active layer 4 may be influenced, a side of the active layer 4 in contact with the source electrode 2 and the drain electrode 3 may not be influenced, thereby ensuring that the active layer 4 is in good contact with the source electrode 2 and the drain electrode 3.

Exemplarily, the etching the photoresist 5 to form the channel region includes:etching the photoresist 5 by dry etching or wet etching.

Etching is performed by dry etching or wet etching so that etching depth may be accurately controlled, which avoids the phenomenon that the photoresist remains due to incomplete etching, or the gate insulating layer 1 is damaged by over etching.

Exemplarily, the photoresist 5 is fluorinated photoresist.

The fluorinated photoresist has higher surface energy, which may ensure that surface energy difference between the fluorinated photoresist and the gate insulating layer 1 is relatively higher. Moreover, the fluorinated photoresist on the gate insulating layer 1, the fluorinated photoresist on the source electrode 2 and the fluorinated photoresist on the drain electrode 3 are similar in film forming situation, so the active layer 4 with an even surface is easily formed. Moreover, the fluorinated photoresist is easily stripped completely so that a following process for removing the photoresist is facilitated, and the surface of the material after the photoresist is removed has no photoresist residues, for example, the photoresist of OSCoR 4001 or OSCoR 5001 may be selected.

Exemplarily, the length-width ratio of the opening region is 10:1 to 50:1. The formed active layer 4 with the corresponding length-width ratio in the opening region with the length-width ratio of 10:1 to 50:1 may be well conducted under drive of the gate electrode 9, and then, the source electrode 2 and the drain electrode 3 are conducted.

Exemplarily, the forming the active layer 4 in the opening region further includes:

Setting a structure parameter of the active layer 4 by controlling annealing time and annealing temperature of the active layer 4. By controlling the annealing time and the annealing temperature of the active layer 4, the active layer 4 consistent with a target structure parameter may be formed.

Figure 6:
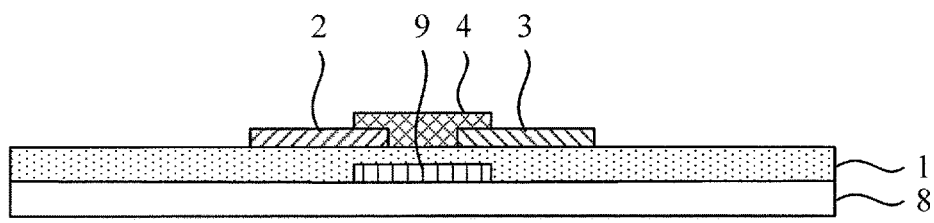

Exemplarily, the array substrate manufacturing method according to embodiment of the present disclosure further comprises:

S5: removing the photoresist 5 outside the opening region, as shown in FIG. 6, so that a structure, such as a passivation layer, may be formed on the active layer 4 subsequently.

Exemplarily, in the embodiment of the present disclosure, while the photoresist 5 outside the opening region is removed, the semiconductor material outside the opening region may be removed, and therefore a step of separately removing the semiconductor material outside the opening region may be omitted, which is not defined by the embodiment of the present disclosure.

Wherein a forming process adopted by the above-mentioned flows, for example, may include: a film forming process, such as, deposition and sputtering, and a patterning process, such as, etching.

Figure 7:
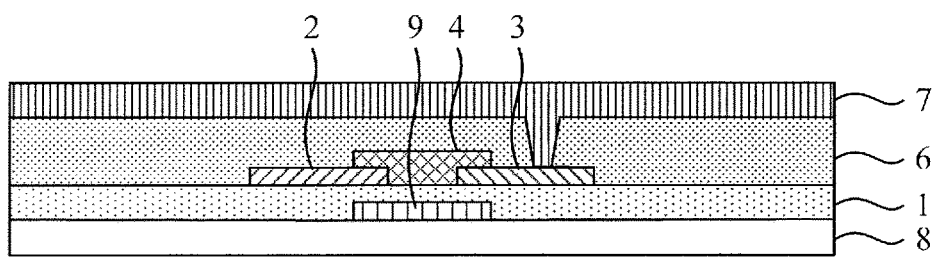
FIG. 7 shows a structural schematic diagram of an array substrate according to an embodiment of the present disclosure.

As shown in FIG. 7, an embodiment of the present disclosure further provides an array substrate, comprising:

A gate insulating layer 1;

A source electrode 2 and a drain electrode 3, arranged on the gate insulating layer 1;

An active layer 4, formed on the gate insulating layer on which the source electrode and the drain electrode are formed, and covering a part of the source electrode 2 and a part of the drain electrode 3 and the gate insulating layer 1 between the source electrode 2 and the drain electrode 3.

Exemplarily, the length-width ratio of the active layer is 10:1 to 50:1.

Exemplarily, the width of the active layer is 5 μm to 50 μm, or 30 μm to 100 μm.

Exemplarily, the array substrate provided by the embodiment of the present disclosure further comprises:

A passivation layer 6, which is arranged on the active layer 4, wherein a through hole is formed in the passivation layer 6;

A pixel electrode 7, which is arranged on the passivation layer 6, and is electrically connected with the drain electrode 3 by the through hole.

Exemplarily, as shown in FIG. 7, the active layer 4 is in direct contact with a part of the source electrode 2 and a part of the drain electrode 3 and the gate insulating layer 1 between the source electrode 2 and the drain electrode 3.

An embodiment of the present disclosure further provides a display panel, comprising any array substrate described above.

An embodiment of the present disclosure further provides a display device, comprising the display panel.

It should be noted that the display device according to an embodiment may be any product or component with a display function, such as an electronic paper, a mobile phone, a tablet computer, a television, a notebook computer, a digital photo frame and a navigator.

By the technical solution, the source electrode and the drain electrode may be formed firstly, then, the opening region is formed in the photoresist, and then, the active layer is directly formed in the opening region; without etching the semiconductor material for forming the active layer, damage to the active layer is avoided.

It should be noted that sizes of the layers and the regions may be exaggerated for purpose of the clarity of diagrams in the drawings. Moreover, it can be understood that when said to be "on" another element or layer, an element or a layer can be directly on other element(s), or there may be a middle layer. Moreover, it can be understood that when said to be "below" another element or layer, an element or a layer can be directly below other element(s), or there may be more than one middle layer or element. Moreover, it can also be understood that when said to be "between" two layers or two elements, a layer or an element may be the unique layer between the two layers or the two elements, or there may also be more than one middle layer or element. Similar reference signs indicate similar elements throughout the description.

The application claims priority of Chinese Patent Application No. 201510435044.1 filed on Jul. 22, 2015, the disclosure of which is incorporated herein by reference in its entirety as part of the present application.

The invention claimed is:

1. An array substrate manufacturing method, comprising:
    forming a source electrode and a drain electrode on a gate insulating layer;
    forming photoresist above the gate insulating layer and the source electrode and the drain electrode;
    etching the photoresist to form an opening region so as to expose the gate insulating layer between the source electrode and the drain electrode, and a part of the source electrode and a part of the drain electrode;
    directly forming an active layer in the opening region, the active layer covering the exposed gate insulating layer, the part of the source electrode and the part of the drain electrode,
    wherein a surface energy of the photoresist is greater than a surface energy of the gate insulating layer; and the array substrate manufacturing method further comprises: after forming the active layer in the opening region, removing the photoresist.

2. The array substrate manufacturing method according to claim 1, wherein the forming the active layer in the opening region includes:
    filling a semiconductor material in the opening region, so as to form the active layer.

3. The array substrate manufacturing method according to claim 2, wherein the filling a semiconductor material in the opening region includes:
    filling the semiconductor material in the opening region by ink-jet printing, silk-screen printing, blade coating or spin coating.

4. The array substrate manufacturing method according to claim 1, wherein a length-width ratio of the opening region is 10:1 to 50:1, and a length-width ratio of the active layer is equal to that of the opening region.

5. The array substrate manufacturing method according to claim 3, wherein under a condition that the semiconductor material is filled in the opening region by ink-jet printing so as to form the active layer, a width of the opening region is 5 μm to 50 μm.

6. The array substrate manufacturing method according to claim 3, wherein under a condition that the semiconductor material is filled in the opening region by silk-screen printing, blade coating or spin coating, so as to form the active layer, a width of the opening region is 30 μm to 100 μm.

7. The array substrate manufacturing method according to claim 3, after the filling the semiconductor material in the opening region by blade coating or spin coating so as to form the active layer, further comprising:
    removing the semiconductor material outside the opening region.

8. The array substrate manufacturing method according to claim 1, wherein the etching the photoresist to form the opening region includes:
    etching the photoresist by dry etching or wet etching.

9. The array substrate manufacturing method according to claim 1, wherein the photoresist is fluorinated photoresist.

10. The array substrate manufacturing method according to claim 1, wherein the forming the active layer in the opening region further includes:
    annealing the active layer, and setting a structure parameter of the active layer by controlling annealing time and annealing temperature.

11. The array substrate manufacturing method according to claim 2, wherein the semiconductor material outside the opening region is removed while the photoresist is removed.

12. An array substrate manufacturing method, comprising:
- forming a source electrode and a drain electrode on a gate insulating layer;
- forming photoresist above the gate insulating layer and the source electrode and the drain electrode;
- etching the photoresist to form an opening region so as to expose the gate insulating layer between the source electrode and the drain electrode, and a part of the source electrode and a part of the drain electrode;
- forming an active layer in the opening region, the active layer covering the exposed gate insulating layer, the part of the source electrode and the part of the drain electrode,
- wherein the photoresist is a fluorinated photoresist, and a surface energy of the fluorinated photoresist is greater than a surface energy of the gate insulating layer; and the array substrate manufacturing method further comprises: after forming the active layer in the opening region, removing the photoresist.

* * * * *